United States Patent
Chu et al.

(10) Patent No.: US 10,515,985 B2
(45) Date of Patent: Dec. 24, 2019

(54) TRANSISTOR DISPLAY PANEL INCLUDING TRANSISTOR HAVING AUXILIARY LAYER OVERLAPPING EDGE OF GATE ELECTRODE

(71) Applicant: Samsung Display Co., Ltd., Yongin-si (KR)

(72) Inventors: Byung Hwan Chu, Seoul (KR); Sho Yeon Kim, Hwaseong-si (KR); Wan-Soon Im, Cheonan-si (KR); Yong Tae Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/059,088

(22) Filed: Aug. 9, 2018

(65) Prior Publication Data

US 2019/0123064 A1    Apr. 25, 2019

(30) Foreign Application Priority Data

Oct. 19, 2017   (KR) .................. 10-2017-0135976

(51) Int. Cl.

| H01L 27/12 | (2006.01) |
|---|---|
| G09G 3/20 | (2006.01) |
| H01L 29/423 | (2006.01) |
| H01L 29/417 | (2006.01) |

(52) U.S. Cl.
CPC ............ *H01L 27/124* (2013.01); *G09G 3/20* (2013.01); *H01L 27/1237* (2013.01); *H01L 29/41733* (2013.01); *H01L 29/42384* (2013.01)

(58) Field of Classification Search
CPC ............ H01L 27/124; H01L 29/41733; H01L 29/42384; H01L 27/1237; G09G 3/20
USPC ........................................................ 257/72
See application file for complete search history.

(56) References Cited

U.S. PATENT DOCUMENTS

| 5,990,491 A | 11/1999 | Zhang | |
|---|---|---|---|
| 6,707,107 B2 | 3/2004 | Kido | |
| 8,383,520 B2 * | 2/2013 | Marrs | ............... H01L 21/02126 438/710 |
| 9,525,023 B2 * | 12/2016 | Miyairi | ................... H01L 29/04 |
| 9,576,984 B1 * | 2/2017 | Shih | ...................... H01L 27/124 |
| 2002/0053701 A1 * | 5/2002 | Kong | .................. G02F 1/13458 257/347 |

(Continued)

FOREIGN PATENT DOCUMENTS

| KR | 10-2004-0040241 | 5/2004 |
|---|---|---|
| KR | 10-0480458 | 4/2005 |

*Primary Examiner* — Mohammad M Hoque
(74) *Attorney, Agent, or Firm* — H.C. Park & Associates, P.L.C.

(57) ABSTRACT

A transistor display panel including a substrate, a gate line disposed on the substrate and extending in a first direction, a gate electrode protruding from the gate line, a gate insulating layer disposed on the gate line and the gate electrode, a semiconductor layer and an auxiliary layer disposed on the gate insulating layer and spaced apart from each other, a data line disposed on the gate insulating layer and extending in a second direction which is a direction crossing the gate line, a drain electrode disposed on the gate insulating layer and the semiconductor layer and spaced apart from the data line, and a pixel electrode connected to the drain electrode, in which the auxiliary layer overlaps an edge of the gate electrode in a plan view.

15 Claims, 9 Drawing Sheets

(56) References Cited

U.S. PATENT DOCUMENTS

| | | | |
|---|---|---|---|
| 2002/0079501 A1* | 6/2002 | Okada | G02F 1/1362 257/88 |
| 2004/0263757 A1* | 12/2004 | Kwon | G02F 1/134363 349/149 |
| 2005/0275609 A1* | 12/2005 | Lee | G09G 3/3677 345/82 |
| 2006/0086978 A1* | 4/2006 | Kobayashi | H01L 27/12 257/347 |
| 2007/0013077 A1* | 1/2007 | Lee | H01L 23/53238 257/762 |
| 2007/0148799 A1* | 6/2007 | Yang | G02F 1/13458 438/30 |
| 2008/0017862 A1* | 1/2008 | Lee | G02F 1/136286 257/59 |
| 2008/0116457 A1* | 5/2008 | Park | H01L 27/1214 257/59 |
| 2009/0090915 A1* | 4/2009 | Yamazaki | H01L 29/04 257/66 |
| 2009/0141207 A1* | 6/2009 | Um | G02F 1/13624 349/46 |
| 2009/0242889 A1* | 10/2009 | Nakayama | H01L 29/66765 257/59 |
| 2010/0025676 A1* | 2/2010 | Yamazaki | H01L 29/78618 257/43 |
| 2010/0065818 A1* | 3/2010 | Kim | B82Y 10/00 257/14 |
| 2010/0201900 A1* | 8/2010 | Lee | G02F 1/13452 349/40 |
| 2010/0301325 A1* | 12/2010 | Bae | H01L 27/1225 257/43 |
| 2010/0308324 A1* | 12/2010 | Kim | H01L 27/1214 257/43 |
| 2011/0096021 A1* | 4/2011 | Kim | G02F 1/13338 345/174 |
| 2011/0124162 A1* | 5/2011 | Lee | H01L 21/268 438/158 |
| 2011/0133193 A1* | 6/2011 | Song | H01L 27/12 257/59 |
| 2012/0037913 A1* | 2/2012 | Seo | H01L 29/458 257/60 |
| 2012/0091461 A1* | 4/2012 | Kim | H01L 29/78618 257/66 |
| 2012/0133873 A1* | 5/2012 | Park | H01L 27/1288 349/138 |
| 2012/0139866 A1* | 6/2012 | Jung | G06F 3/0421 345/174 |
| 2012/0315715 A1* | 12/2012 | Cho | G02F 1/1368 438/30 |
| 2014/0008651 A1* | 1/2014 | Marrs | H01L 29/78696 257/43 |
| 2015/0187804 A1* | 7/2015 | Park | H01L 27/1222 257/43 |
| 2015/0236044 A1* | 8/2015 | Kim | H01L 27/124 257/72 |
| 2015/0311351 A1* | 10/2015 | Seko | H01L 29/78621 257/72 |
| 2015/0318311 A1* | 11/2015 | Cheng | H01L 27/124 257/43 |
| 2015/0333182 A1* | 11/2015 | Guo | H01L 27/1288 257/43 |
| 2016/0342005 A1* | 11/2016 | Kim | G02F 1/1368 |
| 2018/0196556 A1* | 7/2018 | Xu | G06F 3/041 |

* cited by examiner

TRANSISTOR DISPLAY PANEL INCLUDING TRANSISTOR HAVING AUXILIARY LAYER OVERLAPPING EDGE OF GATE ELECTRODE

CROSS-REFERENCE TO RELATED APPLICATION

This application claims priority from and the benefit of Korean Patent Application No. 10-2017-0135976, filed on Oct. 19, 2017, which is hereby incorporated by reference for all purposes as if fully set forth herein.

BACKGROUND

Field

Exemplary embodiments of the invention relate generally to a transistor display panel.

Discussion of the Background

Generally, in a flat panel display, such as a liquid crystal display (LCD) or an organic light emitting diode (OLED) display, a transistor (or a thin film transistor) may be used to independently drive each pixel as a switching element. A transistor display panel including the transistor further includes a gate line for transmitting a gate signal to the transistor, a data line for transmitting a data signal thereto, and the like, in addition to the transistor, and a pixel electrode connected to the transistor.

The transistor includes a semiconductor in which a channel is formed, a gate electrode connected to the gate line, a source electrode connected to the data line, and a drain electrode connected to the pixel electrode.

Generally, light emitted from a light source such as a backlight may be incident on a lower portion of the transistor display panel, and some of the light incident thereto may be reflected between the gate electrode and the source electrode, or between the gate electrode and the drain electrode, and be irradiated to the channel. Thus, characteristics of the transistor may be changed, which may degrade the reliability of the transistor display panel.

The above information disclosed in this Background section is only for understanding of the background of the inventive concepts, and, therefore, it may contain information that does not constitute prior art.

SUMMARY

Devices constructed according to exemplary embodiments of the invention are capable of reducing the change in characteristics of a transistor.

Additional features of the inventive concepts will be set forth in the description which follows, and in part will be apparent from the description, or may be learned by practice of the inventive concepts.

A transistor display panel according to an exemplary embodiment includes a substrate, a gate line disposed on the substrate and extending in a first direction, a gate electrode protruding from the gate line, a gate insulating layer disposed on the gate line and the gate electrode, a semiconductor layer and an auxiliary layer disposed on the gate insulating layer and spaced apart from each other, a data line disposed on the gate insulating layer and extending in a second direction crossing the first direction, a drain electrode disposed on the gate insulating layer and the semiconductor layer, and spaced apart from the data line, and a pixel electrode connected to the drain electrode, in which wherein the auxiliary layer overlaps an edge of the gate electrode in a plan view.

The semiconductor layer and the auxiliary layer may include amorphous silicon.

The data line may include a source electrode extending toward the gate electrode, and the source electrode may be disposed on the gate insulating layer and the semiconductor layer.

The gate electrode may have a first edge, a second edge, and a third edge facing the first edge, a portion of the first edge may overlap the drain electrode in a plan view, a portion of the second edge may overlap the source electrode in a plan view.

The auxiliary layer may overlap at least one of the first edge, the second edge, and the third edge of the gate electrode in a plan view.

The auxiliary layer may include a first auxiliary layer overlapping the drain electrode in a plan view.

The first auxiliary layer may be disposed between the first edge and the drain electrode.

The auxiliary layer may further include a second auxiliary layer spaced apart from the first auxiliary layer, and the second auxiliary layer may overlap the source electrode in a plan view.

The second auxiliary layer may be disposed between the second edge and the source electrode.

The auxiliary layer may overlap the first edge, the second edge, and the third edge of the gate electrode in a plan view.

The auxiliary layer may overlap the source electrode and the drain electrode in a plan view.

A transistor display panel according to an exemplary embodiment includes a substrate, a gate line disposed on the substrate and extending in a first direction, a gate electrode protruding from the gate line, a gate insulating layer disposed on the gate line and the gate electrode, a semiconductor layer and an auxiliary layer disposed on the gate insulating layer and spaced apart from each other, a data line disposed on the semiconductor layer and extending in a second direction crossing the first direction, a source electrode disposed on the semiconductor layer and extending from the data line toward the gate electrode, a drain electrode disposed on the semiconductor layer and spaced apart from the source electrode, and a pixel electrode connected to the drain electrode, in which the auxiliary layer overlaps an edge of the gate electrode in a plan view.

The semiconductor layer and the auxiliary layer may include amorphous silicon.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
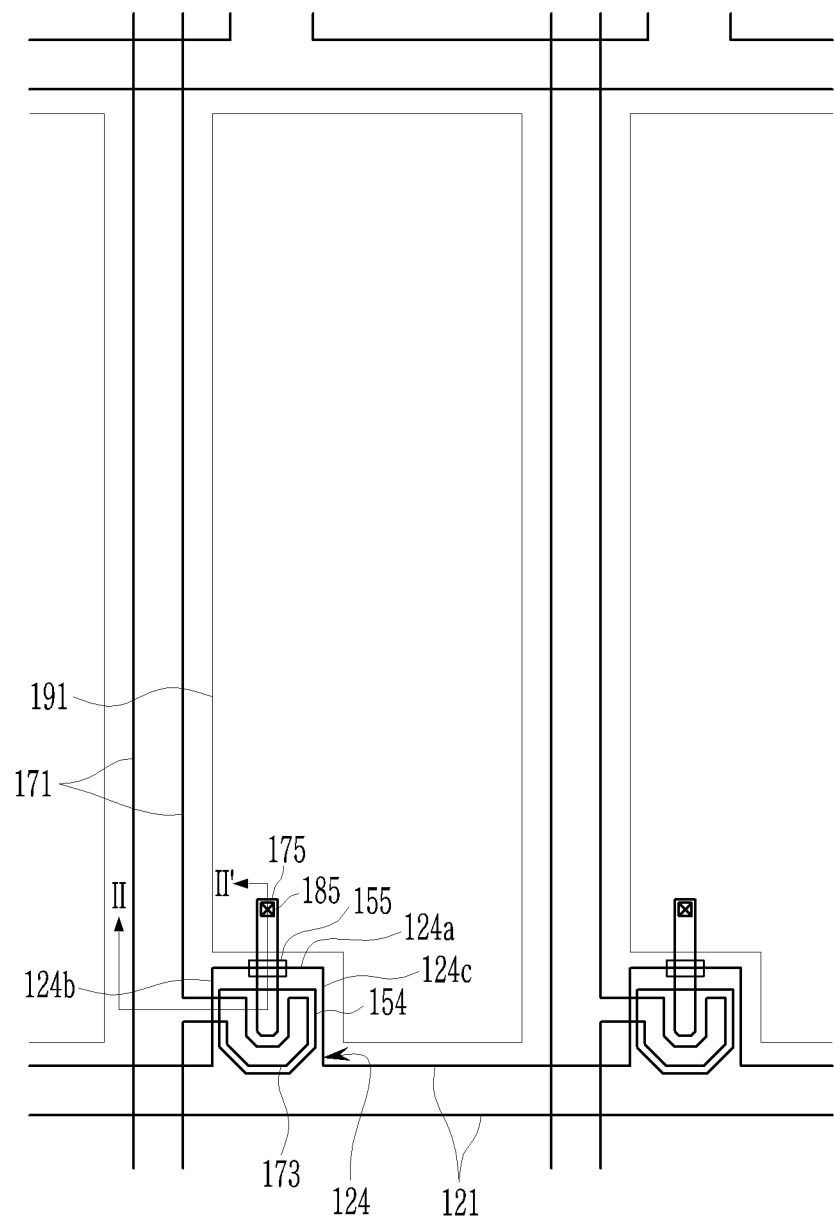
FIG. 1 illustrates a layout view of a transistor display panel according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A transistor display panel according to an exemplary embodiment of the present invention will now be described with reference to FIG. 1 and FIG. 2.

FIG. 1 illustrates a layout view of an example of a transistor display panel according to an exemplary embodiment of the present invention. FIG. 2 illustrates a cross-sectional view taken along line II-II' of the transistor display panel of FIG. 1.

Figure 2:
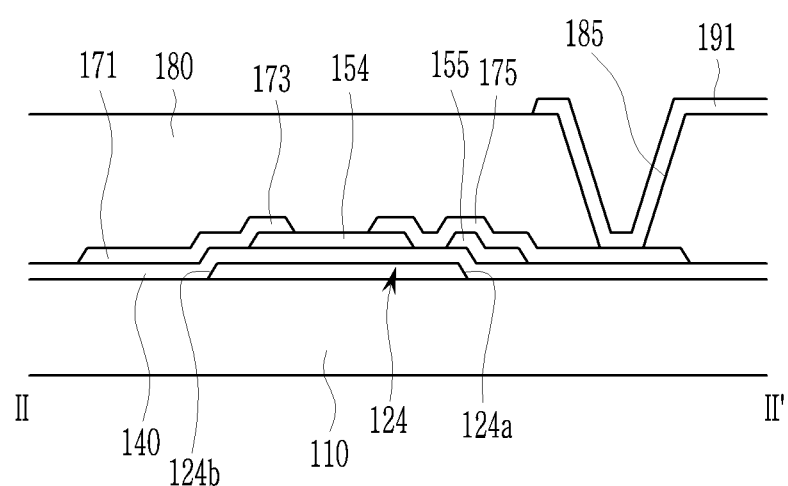
FIG. 2 illustrates a cross-sectional view taken along line II-II' of the transistor display panel of FIG. 1.

Referring to FIG. 1 and FIG. 2, a transistor display panel according to the present exemplary embodiment includes a substrate 110, and a plurality of thin film structures, such as a plurality of gate lines 121, a plurality of semiconductor layers 154, a plurality of first auxiliary layers 155, a plurality of data lines 171, a plurality of drain electrodes 175, and a plurality of pixel electrodes 191 that are disposed on the substrate 110.

The gate lines 121 are disposed on the substrate 110, and the substrate 110 may include an insulating material, such as glass or plastic.

The gate line 121 transmits a gate signal, and substantially extends horizontally. Each gate line 121 includes a plurality of gate electrodes 124 protruding upward from the gate line 121 in a plan view. The gate electrode 124 has a first edge 124a, a second edge 124b, and a third edge 124c. A portion of the first edge 124a overlaps a source electrode 173 described later in a plan view. A portion of the second edge 124b overlaps a drain electrode 175 described later in a plan view. The third edge 124c faces the second edge 124b.

The gate line 121 and the gate electrode 124 may include a conductive material having high reflectivity, such as an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, and the like.

Although the gate line 121 and the gate electrode 124 are shown as having a single-layered structure, the inventive concepts are not limited thereto, and may be formed to have a dual-layered structure or a triple-layered structure.

A gate insulating layer 140 is disposed on the gate line 121. The gate insulating layer 140 may include an inorganic insulating material, such as a silicon oxide ($SiO_x$) or a silicon nitride ($SiN_x$).

The semiconductor layers 154 and the first auxiliary layers 155 are disposed on the gate insulating layer 140. The semiconductor layer 154 and the first auxiliary layer 155 may be spaced apart from each other, and may include amorphous silicon (a-Si).

The semiconductor layer 154 may overlap the gate electrode 124 in a plan view, and the first auxiliary layer 155 may overlap an edge of the gate electrode 124 in a plan view. Specifically, the first auxiliary layer 155 overlaps the first edge 124a of the gate electrode 124 in a plan view.

The data lines 171 are disposed on the gate insulating layer 140, and the drain electrodes 175 are disposed on the gate insulating layer 140 and the semiconductor layer 154.

The data line 171 transmits a data signal, and extends vertically to cross the gate line 121. Each data line 171 extends toward the gate electrode 124, and includes a plurality of source electrodes 173 having a U-shape. The source electrode 173 is disposed on the gate insulating layer 140 and the semiconductor layer 154.

In addition, the drain electrode 175 is disposed on the first auxiliary layer 155. More particularly, the first auxiliary layer 155 is disposed between an upper edge of the gate electrode 124 and the drain electrode 175.

The drain electrode 175 is separated from the data line 171, and extends upwardly extends from a center of a U-shape of the source electrode 173. The shapes of the source electrode 173 and the drain electrode 175 may be variously modified.

The data line 171 and the drain electrode 175 may include a conductive material having high reflectivity, such as an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, and the like.

In the illustrated exemplary embodiment, the data line 171 and the drain electrode 175 are each shown as having a single-layered structure, but the inventive concepts are not limited thereto. For example, the data line 171 and the drain electrode 175 may have a dual-layered structure or a triple-layered structure.

An ohmic contact member may be disposed between the semiconductor layer 154, and the data line 171, and the drain electrode 175. The ohmic contact member may reduce contact resistance between the semiconductor layer 154, and the data line 171, and the drain electrode 175. The ohmic contact member may include n+ hydrogenated amorphous silicon doped with a high concentration of n-type impurities, such as phosphorus (P).

One gate electrode 124, one source electrode 173, and one drain electrode 175 may form one transistor, together with the semiconductor layer 154. A channel of the transistor may be formed at the semiconductor layer 154 between the source electrode 173 and the drain electrode 175, and overlap the gate electrode 124.

A passivation layer 180 is disposed on the data line 171, the drain electrode 175, and the channel of the thin film transistor, and a contact hole 185 overlapping the drain electrode 175 is provided in the passivation layer 180. The passivation layer 180 may include an inorganic material or an organic material. However, the inventive concepts are not limited thereto, and the passivation layer 180 may include a lower layer made of an inorganic material and an upper layer made of an organic material.

The plurality of pixel electrodes 191 are disposed on the passivation layer 180. Each pixel electrode 191 is connected to the drain electrode 175 through the contact hole 185.

Generally, when light emitted from a light source, such as a backlight, is incident on a lower portion of the transistor display panel, some of the incident light may be reflected between the gate electrode 124 and the drain electrode 175 and irradiated to the semiconductor layer 154, which may change the characteristics of the transistor. According to an exemplary embodiment, light may be significantly prevented from being irradiated to the semiconductor layer 154 by disposing the first auxiliary layer 155 between the first edge 124a of the gate electrode 124 and the drain electrode 175, thereby reducing the change in characteristics of the transistor.

The first auxiliary layer 155 may include amorphous silicon, which may absorb most of light having a wavelength of 700 nm or less. Therefore, when some of the light incident on a lower portion of the transistor display panel is reflected from the gate electrode 124 toward the drain electrode 175, since the reflected light is absorbed by the first auxiliary layer 155, light reflected by the gate electrode 124 may be significantly prevented from being irradiated to the semiconductor layer 154. Accordingly, changes in the characteristics of the transistor may be reduced or prevented from being changed, which may increase the reliability of the transistor display panel.

The characteristics of the transistor display panel according to an exemplary embodiment will be described in more detail with reference to FIG. 3.

Figure 3:
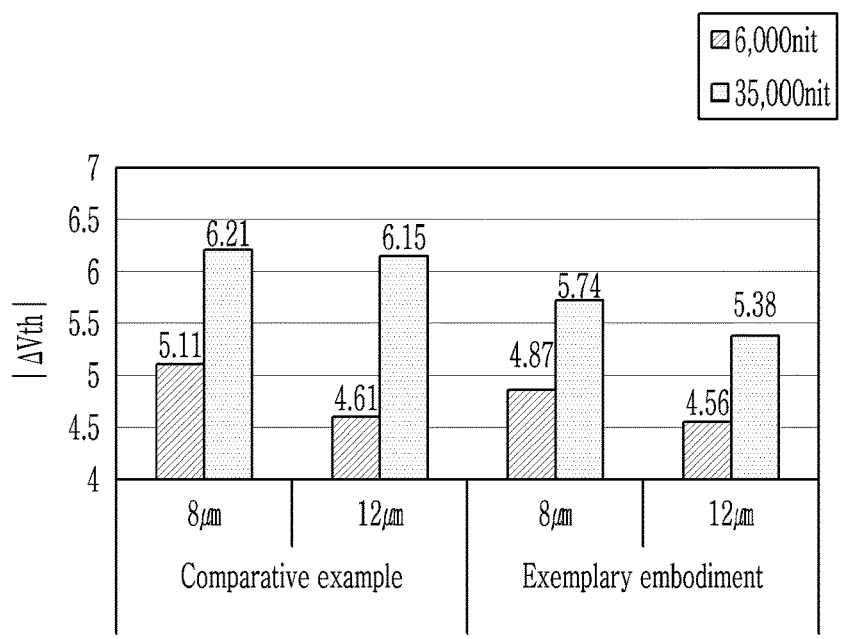
FIG. 3 is a graph showing characteristics of a transistor display panel according to a comparative example and a transistor display panel according to an exemplary embodiment.

FIG. 3 is a graph showing characteristics of a transistor display panel according to a comparative example and a transistor display panel according to an exemplary embodiment.

The transistor display panel according to the comparative example has a structure in which the first auxiliary layer is not disposed between the first edge of the gate electrode and the drain electrode.

A distance between the first edge of the gate electrode and the upper portion of the semiconductor layer in plan view was set as 8 μm and 12 μm, and ΔVth of the transistors of the transistor display panel according to the comparative example and the transistor display panel according to the exemplary embodiment was measured under the same conditions. As used herein, "|ΔVth|" may refer to an absolute value of a change in threshold voltages of a transistor before and after being exposed to light.

Referring to FIG. 3, when a distance between the first edge 124a of the gate electrode 124 and the upper portion of the semiconductor layer 154 in a plan view was 8 μm, and the intensity of the light incident on the lower portion of the transistor display panel was 6000 nit, |ΔVth| of the transistor according to the comparative example was 5.11 and |ΔVth| of the transistor according to the exemplary embodiment was 4.87, and thus, it can be seen that |ΔVth| of the transistor according to the exemplary embodiment decreased by 4.7%.

In addition, when a distance between the first edge 124a of the gate electrode 124 and the upper portion of the semiconductor layer 154 in a plan view was 12 μm, and the intensity of the light incident on the lower portion of the transistor display panel was 35,000 nit, |ΔVth| of the transistor according to the comparative example was 6.21 and |ΔVth| of the transistor according to the exemplary embodiment was 5.74, and thus, it can be seen that |ΔVth| of the transistor according to the exemplary embodiment decreased by 7.6%.

Further, when a distance between the first edge 124a of the gate electrode 124 and the upper portion of the semiconductor layer 154 in a plan view was 12 μm, and the intensity of the light incident on the lower portion of the transistor display panel was 6000 nit, |ΔVth| of the transistor according to the comparative example was 4.61 and |ΔVth| of the transistor according to the exemplary embodiment was 4.56, and thus, it can be seen that |ΔVth| of the transistor according to the exemplary embodiment decreased by 1.1%.

Moreover, when a distance between the first edge 124a of the gate electrode 124 and the upper portion of the semiconductor layer 154 in a plan view was 12 μm, and the intensity of the light incident on the lower portion of the transistor display panel was 35000 nit, |ΔVth| of the transistor according to the comparative example was 6.15 and |ΔVth| of the transistor according to the exemplary embodiment was 5.38, and thus, it can be seen that |ΔVth| of the transistor according to the exemplary embodiment decreased by 12.5%.

As such, it can be seen that |ΔVth| of the transistor according to the exemplary embodiment is improved over that of the transistor according to the comparative example, all else being equal.

A transistor display panel according to exemplary embodiments will now be described with reference to FIG. 4 and FIG. 5.

Figure 4:
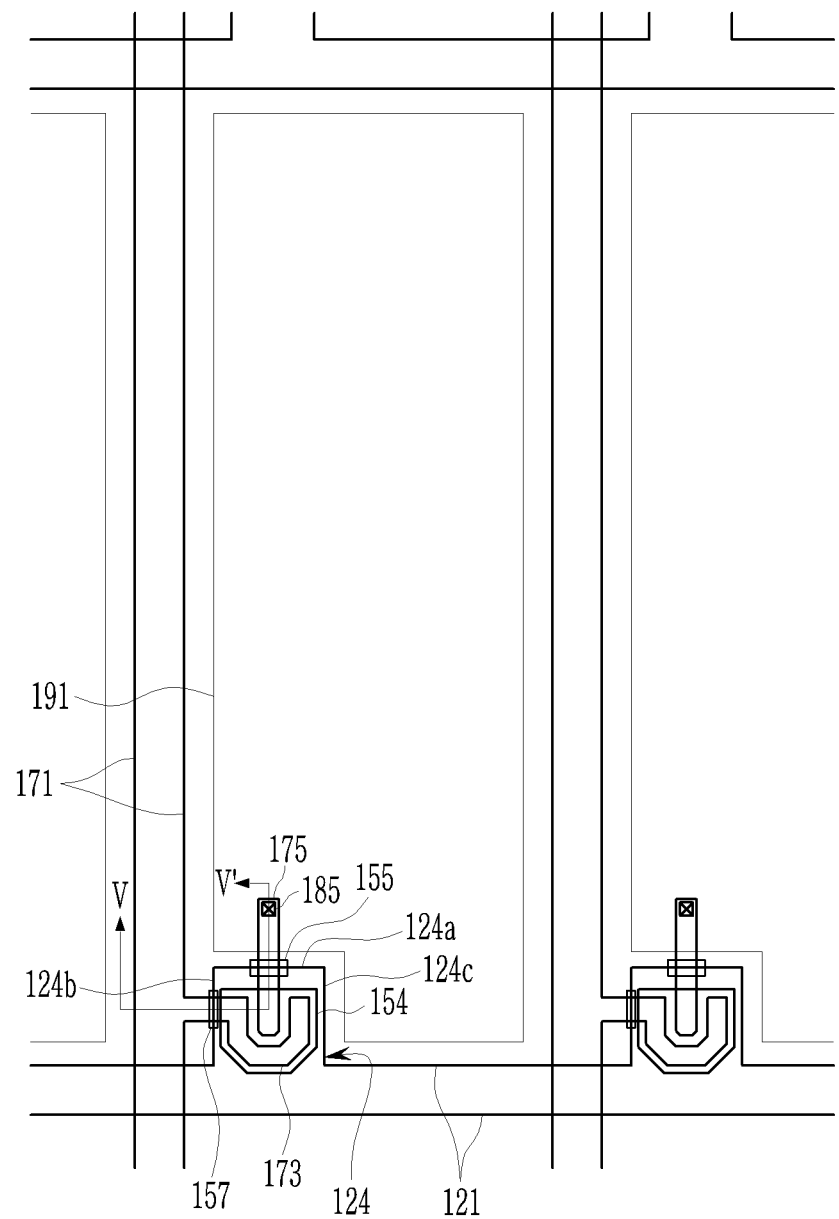
FIG. 4 illustrates a schematic layout view of a transistor display panel according to an exemplary embodiment of the present invention.

FIG. 4 illustrates a schematic layout view of a transistor display panel according to an exemplary embodiment of the present invention. FIG. 5 illustrates a cross-sectional view taken along line V-V' of the transistor display panel of FIG. 4.

Figure 5:
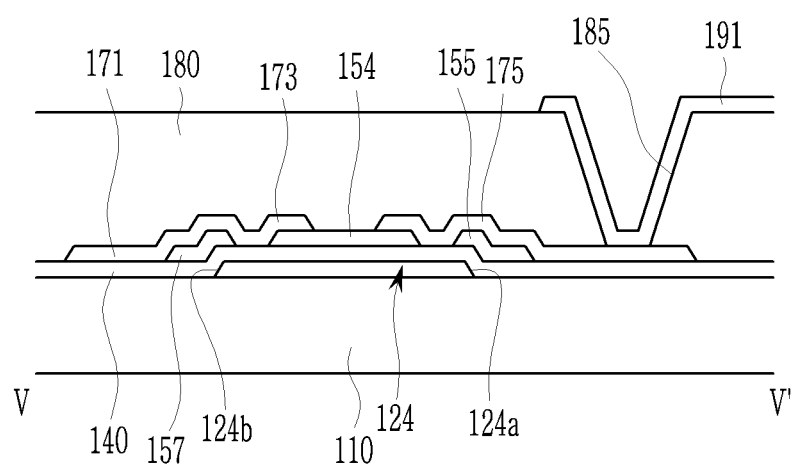
FIG. 5 illustrates a cross-sectional view taken along line V-V' of the transistor display panel of FIG. 4.

The transistor display panel of FIG. 4 and FIG. 5 is substantially the same as the transistor display panel of FIG. 1, except for additional second auxiliary layer 157. Accordingly, duplicated descriptions of substantially the same elements will be omitted to avoid redundancy.

A plurality of semiconductor layers 154, a plurality of first auxiliary layers 155, and a plurality of second auxiliary layers 157 are disposed on the gate insulating layer 140. The first auxiliary layer 155 and the second auxiliary layer 157 are spaced apart from the semiconductor layer 154. In addition, the first auxiliary layer 155 and the second auxiliary layer 157 are spaced apart from each other. The semiconductor layer 154, the first auxiliary layer 155, and the second auxiliary layer 157 may include amorphous silicon (a-Si).

The semiconductor layer 154 may overlap the gate electrode 124 in a plan view, and the first auxiliary layer 155 and the second auxiliary layer 157 may each overlap an edge of the gate electrode 124 in a plan view. Specifically, the first auxiliary layer 155 overlaps the first edge 124a of the gate electrode 124 in a plan view, and the second auxiliary layer 157 overlaps the second edge 124b of the gate electrode 124 in a plan view.

The plurality of data lines 171 are disposed on the gate insulating layer 140, and the plurality of drain electrodes 175 are disposed on the gate insulating layer 140 and the semiconductor layer 154. Each data line 171 extends toward the gate electrode 124, and includes the plurality of source electrodes 173 having the U-shape.

The source electrode 173 is disposed on the gate insulating layer 140, the semiconductor layer 154, and the second auxiliary layer 157. In addition, the drain electrode 175 is disposed on the first auxiliary layer 155. More particularly, the first auxiliary layer 155 is disposed between the first edge 124a of the gate electrode 124 and the drain electrode 175, and the second auxiliary layer 157 is disposed between the second edge 124b of the gate electrode 124 and the source electrode 173.

Generally, when light emitted from the light source, such as the backlight, is incident on the lower portion of the transistor display panel, some of the incident light may be reflected between the gate electrode 124 and the drain electrode 175, and irradiated to the semiconductor layer 154. Alternatively, some of the incident light may be reflected between the gate electrode 124 and the source electrode 173, and irradiated to the semiconductor layer 154, which may change the characteristics of the transistor.

According to an exemplary embodiment, the first auxiliary layer 155 is disposed between the first edge 124a of the gate electrode 124 and the drain electrode 175, and the second auxiliary layer 157 is disposed between the second edge 124b of the gate electrode 124 and the source electrode 173, such that light may be significantly prevented from being irradiated to the semiconductor layer 154, thereby reducing the change in characteristics of the transistor.

The first auxiliary layer 155 and the second auxiliary layer 157 may include amorphous silicon, which may absorb most of light having a wavelength of 700 nm or less. Therefore, when some of the light incident on the lower portion of the transistor display panel is reflected from the gate electrode 124 toward the drain electrode 175, since the reflected light is absorbed by the first auxiliary layer 155, light reflected by the gate electrode 124 may be significantly prevented from being irradiated to the semiconductor layer 154.

In addition, when some of the light incident on a lower portion of the transistor display panel is reflected from the gate electrode 124 toward the source electrode 173, since the reflected light is absorbed by the second auxiliary layer 157, the light reflected by the gate electrode 124 may be significantly prevented from being irradiated to the semiconductor layer 154. As such, changes in the characteristics of the transistor may prevented or substantially reduced, which may improve reliability of the transistor display panel.

A transistor display panel according to an exemplary embodiment of the present invention will now be described with reference to FIG. 6.

Figure 6:
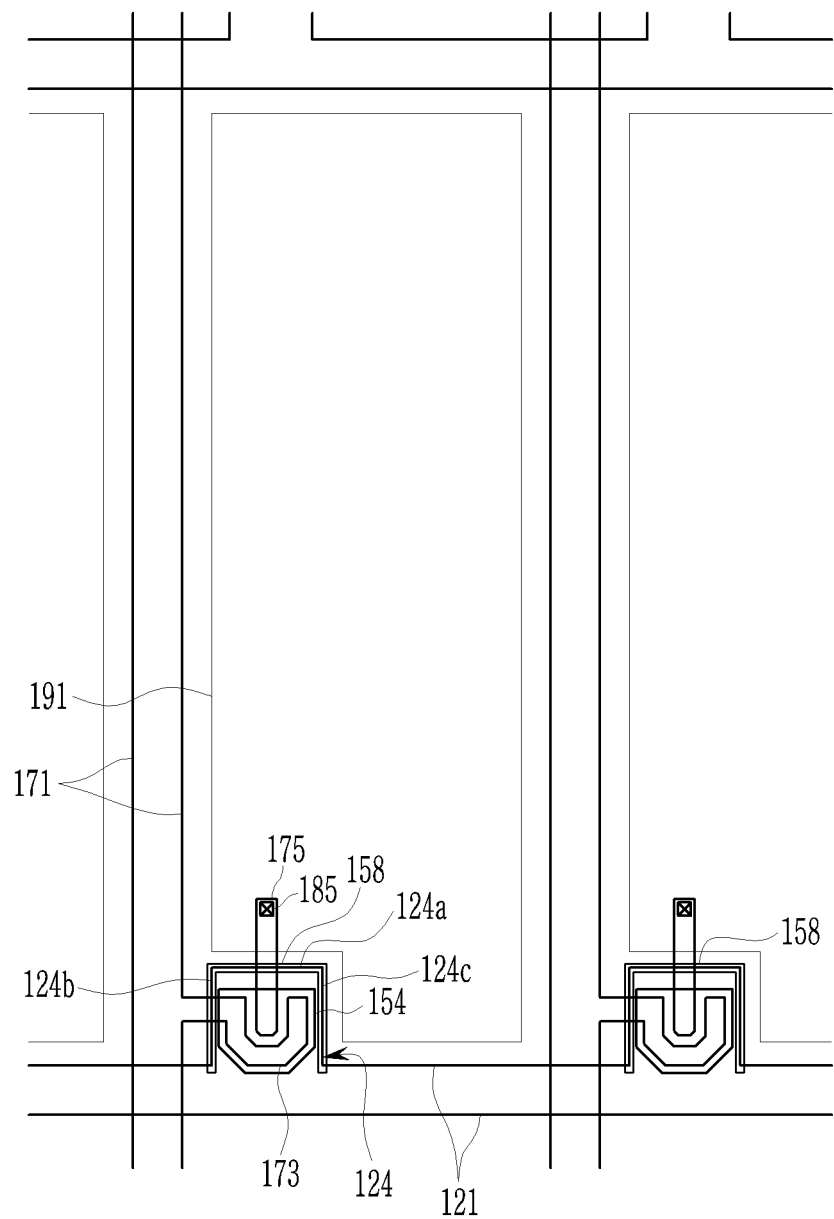
FIG. 6 illustrates a schematic layout view of a transistor display panel according to an exemplary embodiment of the present invention.

FIG. 6 illustrates a schematic layout view of a transistor display panel according to an exemplary embodiment of the present invention. The transistor display panel of FIG. 6 is substantially the transistor display panel of FIG. 1, except for a shape of an auxiliary layer. Accordingly, duplicated descriptions of substantially the same elements will be omitted to avoid redundancy.

A third auxiliary layer 158 spaced apart from the semiconductor layer 154 overlaps the first edge 124a, the second edge 124b, and the third edge 124c of the gate electrode 124 in a plan view.

The third auxiliary layer 158 is disposed on the gate insulating layer 140, and the source electrode 173 and the drain electrode 175 are disposed on the gate insulating layer 140, the semiconductor layer 154, and the third auxiliary layer 158. In particular, the third auxiliary layer 158 is disposed between the first edge 124a of the gate electrode 124 and the drain electrode 175, and between the second edge 124b of the gate electrode 124 and the source electrode 173.

Generally, when light emitted from the light source, such as the backlight, is incident on the lower portion of the transistor display panel, some of the incident light may be reflected between the gate electrode 124 and the drain electrode 175, and irradiated to the semiconductor layer 154. Alternatively, some of the incident light may be reflected between the gate electrode 124 and the source electrode 173, and irradiated to the semiconductor layer 154, which may change the characteristics of the transistor.

According to an exemplary embodiment, the third auxiliary layer 158 is disposed between the first edge 124a of the gate electrode 124 and the drain electrode 175, and between the second edge 124b of the gate electrode 124 and the source electrode 173, which may significantly prevent light from being irradiated to the semiconductor layer 154, thereby preventing the changes in the characteristics of the transistor.

The third auxiliary layer 158 may include amorphous silicon, which may absorb most of light having a wavelength of 700 nm or less. Therefore, when some of the light incident on the lower portion of the transistor display panel is reflected from the gate electrode 124 toward the drain electrode 175 or the source electrode 173, since the reflected light is absorbed by the third auxiliary layer 158, the light reflected by the gate electrode 124 may be significantly prevented from being irradiated to the semiconductor layer 154.

In addition, since the third auxiliary layer 158 overlaps the first edge 124a, the second edge 124b, and the third edge 124c of the gate electrode 124, some of the light incident on the lower portion of the transistor display panel is diffracted by the gate electrode 124, which may further prevent light from being irradiated to the semiconductor layer 154. Accordingly, changes in the characteristics of the transistor may be prevented, which may improve reliability of the transistor array panel.

A transistor display panel according to an exemplary embodiment of the present invention will now be described with reference to FIG. 7 to FIG. 9.

Figure 7:
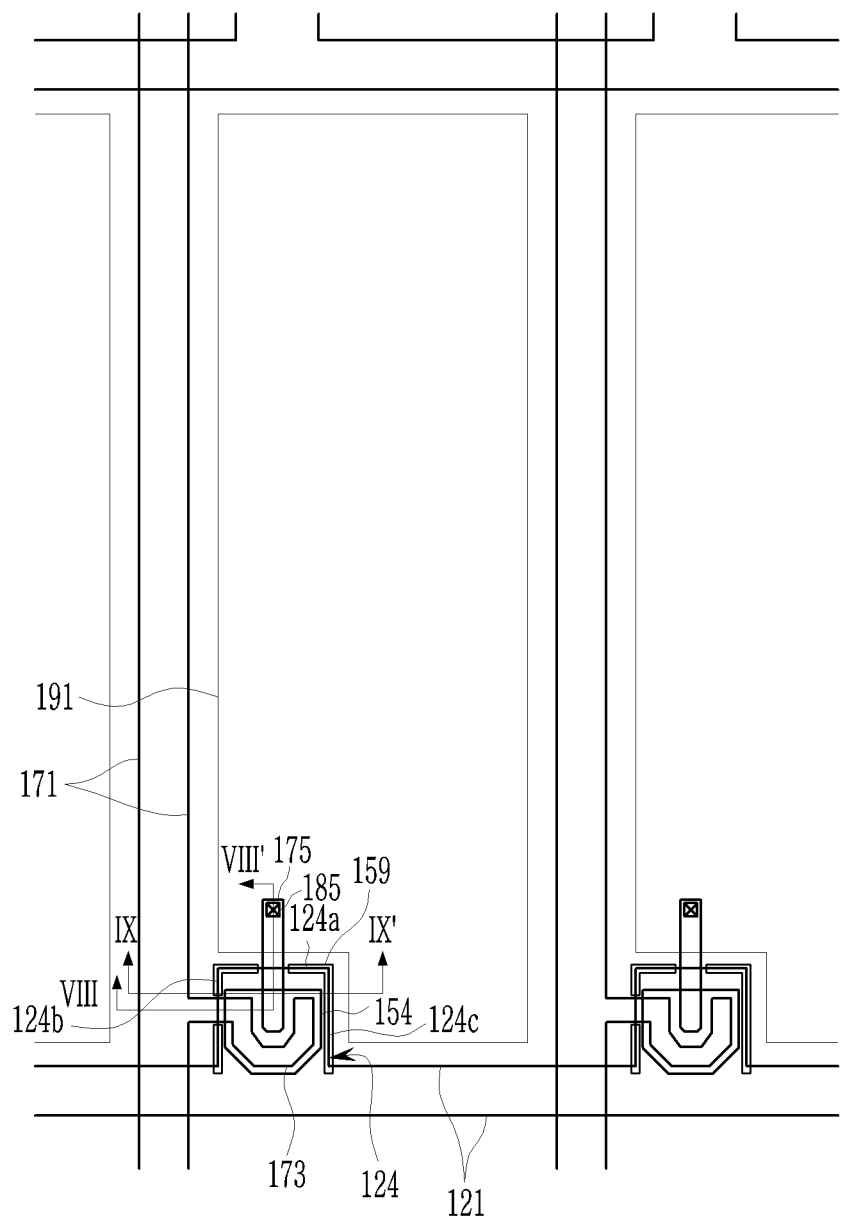
FIG. 7 illustrates a schematic layout view of a transistor display panel according to an exemplary embodiment of the present invention.

FIG. 7 illustrates a schematic layout view of a transistor display panel according to an exemplary embodiment of the present invention. FIG. 8 illustrates a cross-sectional view taken along line VIII-VIII' of a transistor display panel of FIG. 7. FIG. 9 illustrates a cross-sectional view taken along line IX-IX' of a transistor display panel of FIG. 7.

Figure 8:
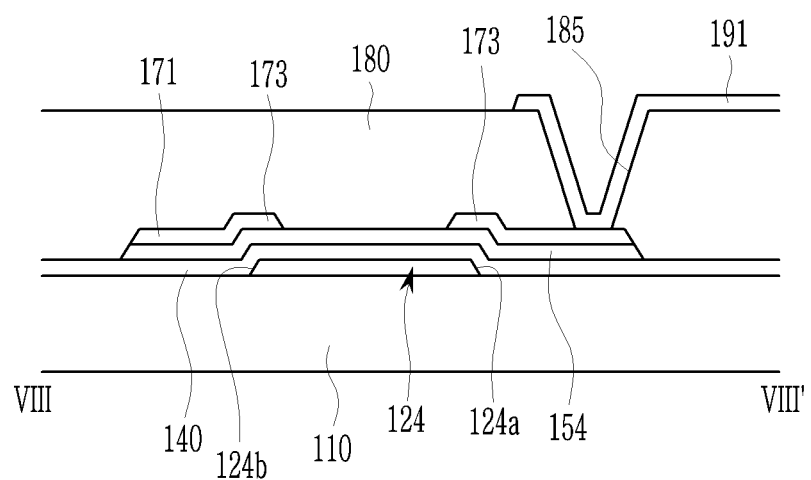
FIG. 8 illustrates a cross-sectional view taken along line VIII-VIII' of the transistor display panel of FIG. 7.
Figure 9:
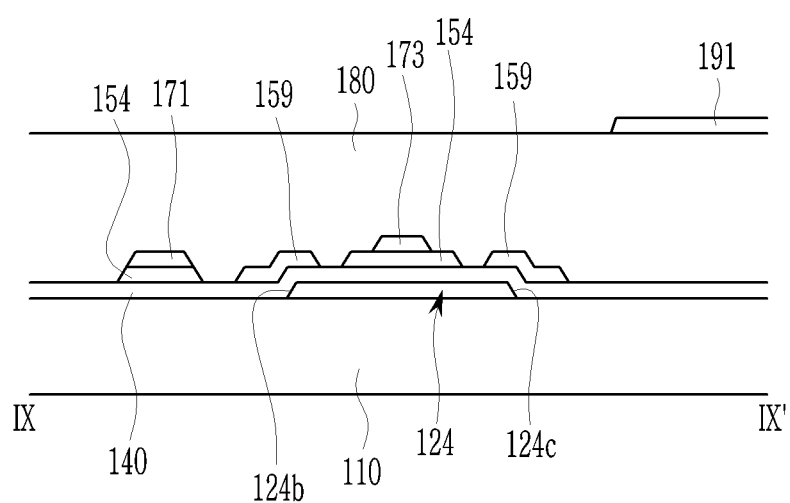
FIG. 9 illustrates a cross-sectional view taken along line IX-IX' of the transistor display panel of FIG. 7.

Referring to FIG. 7 to FIG. 9, the transistor display panel according to the illustrated exemplary embodiment includes the substrate 110, and a plurality of thin film structures, such as the gate lines 121, the semiconductor layers 154, a plurality of fourth auxiliary layers 159, the data lines 171, the drain electrodes 175, and the pixel electrodes 191 disposed on the substrate 110.

The gate lines 121 are disposed on the substrate 110 including an insulating material, such as glass or plastic. The gate line 121 transmits a gate signal, and extends substantially in a horizontal direction. Each gate line 121 includes a plurality of gate electrodes 124 protruding upward from the gate line 121 in a plan view. The gate electrode 124 has a first edge 124a, a second edge 124b, and a third edge 124c. Some of the first edge 124a overlaps a source electrode 173 described later in a plan view. Some of the second edge 124b overlaps a drain electrode 175 described later in a plan view. The third edge 124c faces the second edge 124b.

The gate line 121 and the gate electrode 124 may include a conductive material having high reflectivity, such as an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, and the like.

In the illustrated exemplary embodiment, the gate line 121 and the gate electrode 124 are shown as having a single-layered structure, but the inventive concepts are not limited thereto. For example, the gate line 121 and the gate electrode 124 may have a dual-layered structure or a triple-layered structure.

The gate insulating layer 140 is disposed on the gate line 121. The gate insulating layer 140 may be made of an inorganic insulating material, such as a silicon oxide ($SiO_x$) or a silicon nitride ($SiN_x$).

The plurality of semiconductor layers 154 and the plurality of fourth auxiliary layers 159 are disposed on the gate insulating layer 140. The semiconductor layer 154 and the fourth auxiliary layer 159 are spaced apart from each other, and may each include amorphous silicon (a-Si).

The fourth auxiliary layer 159 overlaps the first edge 124a, the second edge 124b, and the third edge 124c the gate electrode 124 in a plan view. The plurality of data lines 171 and the plurality of drain electrodes 175 are disposed on the semiconductor layer 154.

The data line 171 transmits a data signal, and extends substantially vertically to cross the gate line 121. Each data line 171 extends toward the gate electrode 124, and includes the plurality of source electrodes 173 having the U-shape. The fourth auxiliary layer 159 is spaced apart from the semiconductor layer 154, and thus, the fourth auxiliary layer 159 does not overlap the source electrode 173 and the drain electrode 175 in a plan view.

The drain electrode 175 is spaced apart from the data line 171, and extends upwardly from a center of the source electrode 173 having a U-shape. The shapes of the source electrode 173 and the drain electrode 175 are one example, and may be variously modified.

The data line 171 and the drain electrode 175 may include a conductive material having high reflectivity, such as an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, and the like.

In the illustrated exemplary embodiment, the data line 171 and the drain electrode 175 are shown as having a single-layered structure, but the inventive concepts are not limited thereto. For example, the data line 171 and the drain electrode 175 may have a dual-layered structure or a triple-layered structure.

The ohmic contact member may be disposed between the semiconductor layer 154, and the data line 171, and the drain electrode 175. The ohmic contact member may reduce the contact resistance between the semiconductor layer 154, and the data line 171 and the drain electrode 175. The ohmic contact member may include n+ hydrogenated amorphous silicon doped with a high concentration of n-type impurities, such as phosphorus (P).

One gate electrode 124, one source electrode 173, and one drain electrode 175 may form one transistor together with the semiconductor layer 154. A channel of the transistor is formed at the semiconductor layer 154 between the source electrode 173 and the drain electrode 175, and overlaps the gate electrode 124.

The passivation layer 180 is disposed on the data line 171, the drain electrode 175, and the channel of the thin film transistor. The contact hole 185 overlapping the drain electrode 175 is provided in the passivation layer 180. The passivation layer 180 may include an inorganic material or an organic material. However, the inventive concepts are limited thereto, and the passivation layer 180 may include the lower layer made of an inorganic material and the upper layer made of an organic material.

The plurality of pixel electrodes 191 are disposed on the passivation layer 180. Each pixel electrode 191 is connected to the drain electrode 175 through the contact hole 185.

Generally, when light emitted from the light source, such as the backlight, is incident on the lower portion of the transistor display panel, some of the incident light may be diffracted by the gate electrode 124, and irradiated to the semiconductor layer 154, which may change the characteristics of the transistor.

According to an exemplary embodiment, the fourth auxiliary layer 159 is disposed to overlap the first edge 124a, the second edge 124b, and the third edge 124c of the gate electrode 124, such that light may be significantly prevented from being irradiated to the semiconductor layer 154, thereby preventing changes in the characteristics of the transistor.

The fourth auxiliary layer 159 may include amorphous silicon, which absorbs most of light having a wavelength of 700 nm or less. Therefore, when some of the light incident on the lower portion of the transistor display panel is diffracted by the gate electrode 124 and irradiated to the semiconductor layer 154, the fourth auxiliary layer 159 absorbs the diffracted light and significantly prevents the light diffracted by the gate electrode 124 from being irradiated to the semiconductor layer 154. Accordingly, changes in the characteristics of the transistor may be prevented, which may improve the reliability of the transistor display panel.

According to the exemplary embodiments, it is possible to prevent or substantially reduce changes in the characteristics of a transistor, and prevent deterioration of the reliability of a transistor display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A transistor display panel comprising:
   a substrate;
   a gate line disposed on the substrate and extending in a first direction;
   a gate electrode protruding from the gate line;
   a gate insulating layer disposed on the gate line and the gate electrode;
   a semiconductor layer and an auxiliary layer disposed on the gate insulating layer and spaced apart from each other;
   a data line disposed on the gate insulating layer and extending in a second direction crossing the first direction;
   a drain electrode disposed on the gate insulating layer and the semiconductor layer, and spaced apart from the data line; and
   a pixel electrode connected to the drain electrode,
   wherein:
   the auxiliary layer overlaps an edge of the gate electrode and does not overlap the semiconductor layer in a plan view; and
   the semiconductor layer includes a channel overlapping the gate electrode.

2. The transistor display panel of claim 1, wherein the semiconductor layer and the auxiliary layer comprise amorphous silicon.

3. The transistor display panel of claim 2, wherein:
   the data line comprises a source electrode extending toward the gate electrode; and
   the source electrode is disposed on the gate insulating layer and the semiconductor layer.

4. The transistor display panel of claim 3, wherein:
the gate electrode has a first edge, a second edge, and a third edge facing the second edge;
a portion of the first edge overlaps the drain electrode in a plan view; and
a portion of the second edge overlaps the source electrode in a plan view.

5. The transistor display panel of claim 4, wherein the auxiliary layer overlaps at least one of the first edge, the second edge, and the third edge of the gate electrode in a plan view.

6. The transistor display panel of claim 5, wherein the auxiliary layer comprises a first auxiliary layer overlapping the drain electrode in a plan view.

7. The transistor display panel of claim 6, wherein the first auxiliary layer is disposed between the first edge and the drain electrode.

8. The transistor display panel of claim 7, wherein:
the auxiliary layer further comprises a second auxiliary layer spaced apart from the first auxiliary layer; and
the second auxiliary layer overlaps the source electrode in a plan view.

9. The transistor display panel of claim 8, wherein the second auxiliary layer is disposed between the second edge of the gate electrode and the source electrode.

10. The transistor display panel of claim 5, wherein the auxiliary layer overlaps the first edge, the second edge, and the third edge of the gate electrode in a plan view.

11. The transistor display panel of claim 10, wherein the auxiliary layer overlaps the source electrode and the drain electrode in a plan view.

12. A transistor display panel comprising:
a substrate;
a gate line disposed on the substrate and extending in a first direction;
a gate electrode protruding from the gate line;
a gate insulating layer disposed on the gate line and the gate electrode;
a semiconductor layer and an auxiliary layer disposed on the gate insulating layer and spaced apart from each other;
a data line disposed on the semiconductor layer and extending in a second direction crossing the first direction;
a source electrode disposed on the semiconductor layer and extending from the data line toward the gate electrode;
a drain electrode disposed on the semiconductor layer and spaced apart from the source electrode; and
a pixel electrode connected to the drain electrode,
wherein:
the auxiliary layer overlaps an edge of the gate electrode and does not overlap the semiconductor layer in a plan view; and
the semiconductor layer includes a channel overlapping the gate electrode.

13. The transistor display panel of claim 12, wherein the semiconductor layer and the auxiliary layer comprise amorphous silicon.

14. The transistor display panel of claim 13, wherein:
the gate electrode has a first edge, a second edge, and a third edge facing the second edge;
a portion of the first edge overlaps the drain electrode in a plan view;
a portion of the second edge overlaps the source electrode in a plan view.

15. The transistor display panel of claim 14, wherein the auxiliary layer overlaps the first edge, the second edge, and the third edge of the gate electrode.

* * * * *